(12) United States Patent
Richoz

(10) Patent No.: US 9,358,722 B2
(45) Date of Patent: Jun. 7, 2016

(54) METHOD OF PROTECTING AN ELECTRICAL COMPONENT IN A LAMINATE

(71) Applicant: ASSA ABLOY AB, Stockholm (SE)

(72) Inventor: David Richoz, Hauteville (CH)

(73) Assignee: ASSA ABLOY AB, Stockholm (SE)

( * ) Notice: Subject to any disclaimer, the term of this patent is extended or adjusted under 35 U.S.C. 154(b) by 0 days.

(21) Appl. No.: 14/428,458

(22) PCT Filed: Aug. 28, 2013

(86) PCT No.: PCT/IB2013/058059
§ 371 (c)(1),
(2) Date: Mar. 16, 2015

(87) PCT Pub. No.: WO2014/045139
PCT Pub. Date: Mar. 27, 2014

(65) Prior Publication Data
US 2015/0298389 A1    Oct. 22, 2015

(30) Foreign Application Priority Data

Sep. 18, 2012    (CH) ........................................ 1687/12

(51) Int. Cl.
*B29C 65/02*    (2006.01)
*G06K 7/10*    (2006.01)
(Continued)

(52) U.S. Cl.
CPC ............. *B29C 65/02* (2013.01); *B29C 66/7314* (2013.01); *G06K 7/10316* (2013.01); *G06K 19/07728* (2013.01); *G06K 19/07749* (2013.01); *H01L 21/56* (2013.01);
(Continued)

(58) Field of Classification Search
CPC .............. H05K 1/185; H05K 2203/13; H05K 2203/1327; H01L 2924/00; H01L 2224/2919; H01L 23/5389; H01L 2224/04105; H01L 51/5253; H01L 2224/8385; H01L 2224/11849; H01L 21/56; H01L 27/14618; H01L 27/14683
USPC .......................................... 438/106, 127, 64
See application file for complete search history.

(56) References Cited

U.S. PATENT DOCUMENTS

2002/0137263 A1    9/2002    Towle et al.
2003/0201331 A1    10/2003    Finkelstein

FOREIGN PATENT DOCUMENTS

AU    2008249220    1/2010
DE    29812383    10/1998
(Continued)

OTHER PUBLICATIONS

International Search Report prepared by the European Patent Office on Feb. 4, 2014, for International Application No. PCT/IB2013/058059.
(Continued)

*Primary Examiner* — Caleen Sullivan
(74) *Attorney, Agent, or Firm* — Sheridan Ross P.C.

(57) ABSTRACT

A method for protecting an electrical component in a support layer of a functional laminate comprises the steps of providing the support layer with a first hole, a second hole and an opening connecting the first and the second holes together, positioning an electrical component inside the first hole, placing a patch of plastic material in the second hole, and causing the material of the patch to flow through the opening from the second hole to the first hole, flowing around the electrical component in order to surround it.

9 Claims, 5 Drawing Sheets

(51) Int. Cl.
*B29C 65/00* (2006.01)
*H01L 23/31* (2006.01)
*H01L 21/56* (2006.01)
*G06K 19/077* (2006.01)
*B29K 75/00* (2006.01)
*B29L 9/00* (2006.01)
*B29L 31/34* (2006.01)

(52) U.S. Cl.
CPC ........ *H01L 23/3121* (2013.01); *B29K 2075/00* (2013.01); *B29K 2995/0091* (2013.01); *B29L 2009/00* (2013.01); *B29L 2031/3456* (2013.01); *B29L 2031/3481* (2013.01); *H01L 2224/4847* (2013.01); *H01L 2224/49175* (2013.01)

(56) References Cited

FOREIGN PATENT DOCUMENTS

| | | |
|---|---|---|
| DE | 197 16 912 A1 | 11/1998 |
| EP | 2465344 | 6/2012 |
| JP | H10 92970 A | 4/1998 |
| WO | WO 2007/061303 A1 | 5/2007 |

OTHER PUBLICATIONS

Written Opinion prepared by the European Patent Office on Feb. 4, 2014, for International Application No. PCT/IB2013/058059.

Extended European Search Report for European Patent Application No. 14183362.4, mailed Feb. 6, 2015, 6 pages.

METHOD OF PROTECTING AN ELECTRICAL COMPONENT IN A LAMINATE

CROSS REFERENCE TO RELATED APPLICATIONS

This application is a national stage application under 35 U.S.C. 371 and claims the benefit of PCT Application No. PCT/IB2013/058059 having an international filing date of Aug. 28, 2013, which designated the United States, which PCT application claimed the benefit of Swiss Patent Application No. ch01687/12 filed Sep. 18, 2012, the disclosure of each of which are incorporated herein by reference.

TECHNICAL FIELD

The invention relates to the field of functional laminates.

BACKGROUND

Functional laminates are documents resulting from the lamination of a plurality of layers. In particular functional laminates are used as security documents such as smart cards, ID cards, credit cards and the like. Functional laminates also refer to semi-finished products like pre-laminates or inlays, which are used for example for the manufacturing of smart cards equipped with chips or chip modules, RFID antennae and the like. They usually consist of a number of core layers and two or more cover layers covering the core layers, wherein a chip module is embedded in the layers. The layers usually consist of a plastic material such as polycarbonate or polyethylene terephthalate.

International publication WO2009135823 to HID GLOBAL discloses an example of a functional laminate, which is able to absorb mechanical stress caused by shrinkage of the cover layer in the laminating process. When the layers are laminated using heat and/or pressure the macromolecules of the plastic material tend to shorten thus causing the plastic material to shrink. Since the chip module itself does not shrink the material is subjected to mechanical stress eventually leading to deforming, cracking or delaminating the material thus limiting the service life of the functional laminate. The functional laminate is achieved by using a patch layer placed adjacent to a support layer supporting the chip or chip module. A material from which the patch layer is made will flow around the chip or chip module during lamination, thereby creating a zone around the chip that absorbs mechanical stress when the functional laminate is subjected to heat. A similar structure with similar function is also described in International publication WO200761303 and US publication U.S. Pat. No. 4,450,024.

Another solution for protecting a chip or chip module inside a functional laminate against mechanical stress is to inject a resin material in the zone around the chip or chip module. Such solutions are described for example in German publication DE 19716912 and European publication EP 1 161 48. The latter also discloses a cavity in the support layer, in proximity of the zone where the chip or chip module is located, whereby the cavity is arranged as a reservoir to receive any excess resin during the injection process.

SUMMARY OF INVENTION

In one aspect the invention provides a method for protecting an electrical component in a support layer of a functional laminate. The method comprises the steps of providing the support layer with a first hole, a second hole and an opening connecting the first and the second holes together, positioning an electrical component inside the first hole, placing a patch of plastic material in the second hole, and causing the material of the patch to flow through the opening from the second hole to the first hole, flowing around the electrical component in order to surround it.

In a preferred embodiment the step of causing the material of the patch to flow is a lamination step involving the support layer, whereby the patch melts down as it is submitted to heating and pressure.

In a further preferred embodiment the melting point of the material of the patch is below the melting point of the material of the support layer.

In an even further preferred embodiment, the method further comprises a step of choosing a patch volume such as to correspond at least to the addition of a volume of the second hole, a volume of the opening and a volume filling the surrounding of the electrical component in the first hole.

In an other preferred embodiment a plurality of second holes receives each one of a plurality of patches and the material of this plurality of patches flows through a plurality of openings connecting each of the second holes to the first hole.

In still an other preferred embodiment the patch is originally thicker than the support layer such that it protrudes out of the second hole when it is placed in it.

In a preferred embodiment the support layer is provided with a carrier layer such as to create a below surface covering at least a part of bottom apertures corresponding respectively to the first or second holes or the opening on one the bottom face of the support layer.

In a preferred embodiment the carrier layer is sealed to the support layer such that at least a part of the said bottom apertures are hermitically closed.

In a preferred embodiment the electrical component is a RFID chip connected to an antenna fixed to the support layer.

BRIEF DESCRIPTION OF THE FIGURES

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The detailed description given herein below makes use of the accompanying drawings, which are given by way of illustration only, and thus, are not limitative of the present invention, wherein.

DESCRIPTION OF PREFERRED EMBODIMENTS

The invention relates to functional laminates, such as for example a support layer that comprises an embedded wire antenna and a hole wherein a chip is placed and connected to the wire antenna. More precisely, the invention relates to a method for preventing a crack in a plastic structure of the laminate surrounding the chip.

Figure 1:
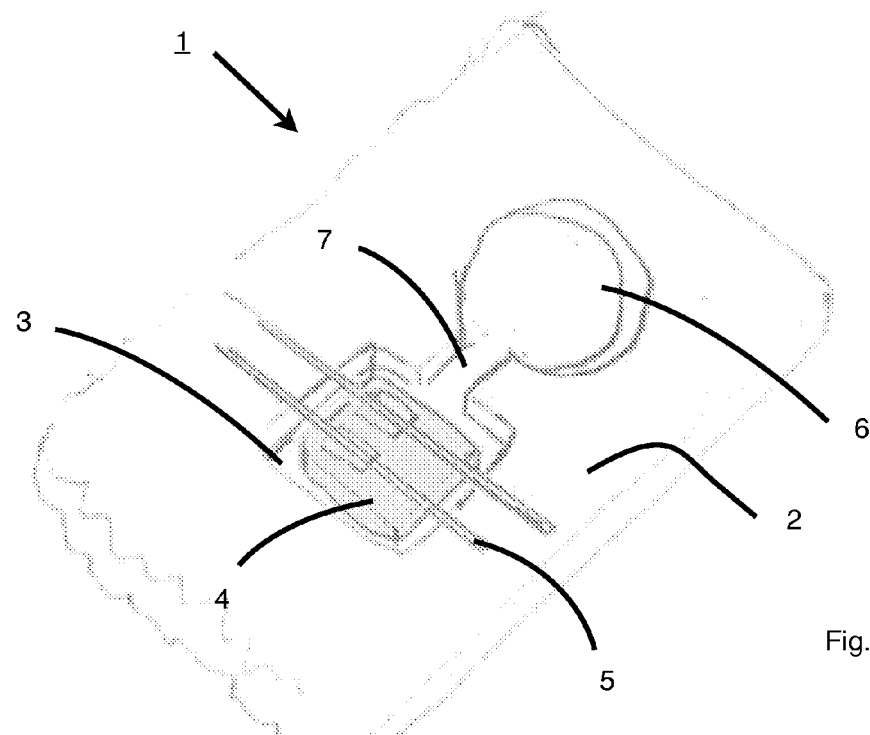
FIG. 1 illustrates an example embodiment of a support layer according to the invention.

FIG. 1 shows an example of the functional laminate 1 which comprises the support layer 2 and the hole 3, wherein the chip 4 (or chip module) is placed. The support layer 2 is intended to receive the embedded wire antenna (not shown in FIG. 1) which is connected to the chip 4 by means of antenna connection wires 5.

The term hole is used herein to designate a volume obtained from an excavation in the support layer. Other terms could have been used instead to designate the same object, including for example the terms cavity, groove and recess . . . .

The object placed inside the hole 3 is designated herein as chip 4, but it is understood that it could well be replaced by a different object as could be useful in a functional laminate, including for example an electrical component, a chip module and a miniaturized electronic circuit.

It is further understood that the support layer 2 will in general only constitute a part of the functional laminate, and that in order to complete the functional laminate it may be appropriate to add on for example a further layer by means of lamination. This however is not part of the invention and can easily be implemented by a person skilled in the art without any particular difficulty.

In the support layer 2, a second hole 6 is made located relatively close to the hole 3. An opening 7 connects the hole 3 and the second hole 6 such that a fluid may flow from one hole to the other.

Figure 2:
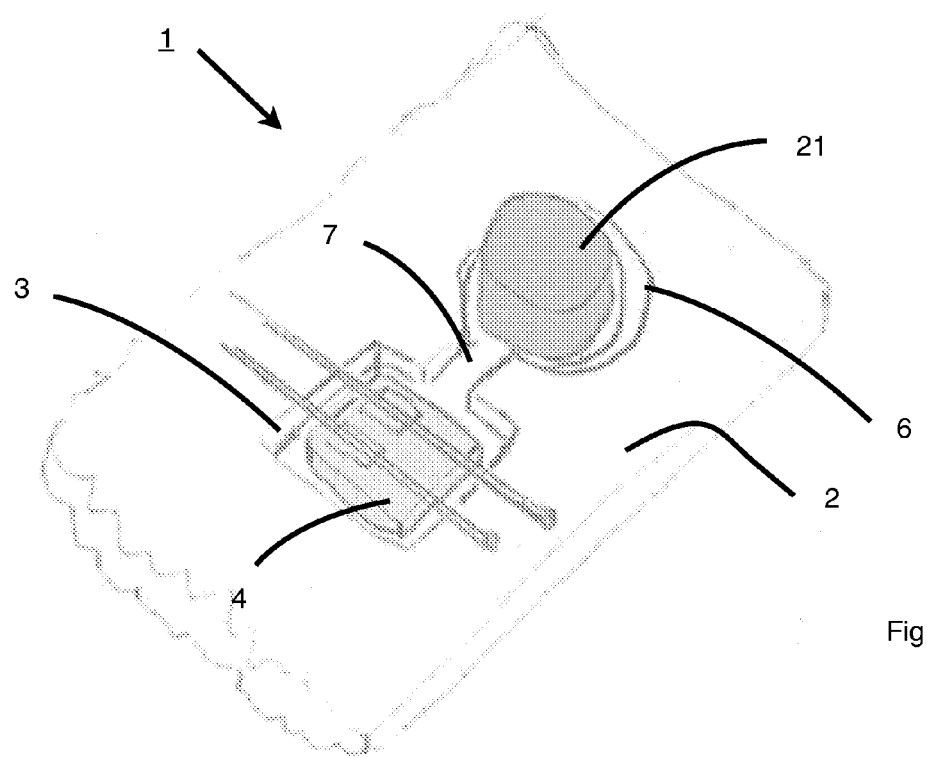
FIG. 2 illustrates the embodiment of FIG. 1 in which a patch is added according to the invention.

FIG. 2 shows the functional laminate 1 from FIG. 1, wherein a patch 21 of PU (Polyurethane) is put in the empty second hole 6. In a preferred embodiment, the patch 21 will be thicker than a final thickness of the support layer 2 in order to allow filling both the hole 3 and the second hole 6 after a lamination step. The lamination step will be explained herein below. The fact that the patch is thicker than a final thickness of the support layer 2, implicitly means that a patch volume of the patch 21 corresponds at least to the addition of a first volume of the second hole 6, a second volume of the opening 7 and a third volume filling a surrounding of the electrical component, i.e., the chip 4 in the hole 3.

In a preferred embodiment, the chip 4 is connected to an antenna connection wire 5 embedded in the substrate 2. The method to achieve such manufacturing step is well known in the art as described for example in EP 0 880 754 or in pending International application PCT/EP2012/063671. The finished good will be for example a contactless card or a contactless inlay (which will be intended to be used to manufacture a contactless card). In such a case, the bonding of the antenna connection wire 5 to the pads of the chip 4 is achieved by thermo compression. An issue is that the temperatures involved in the bonding step are so high, that it could damage the surrounding material, as the plastic materials of the support layer substrate 2 or of the patch 21. This is why in most of the prior art, the patch material is added after the connection has been completed. A direct advantage of the invention is so that one is free to dispatch the patch 21 in the second hole 6 independently of the bonding process. The patch material is anyway far enough of the chip 4 not to be damaged during the bonding of the antenna connection wires 5.

Figure 3:
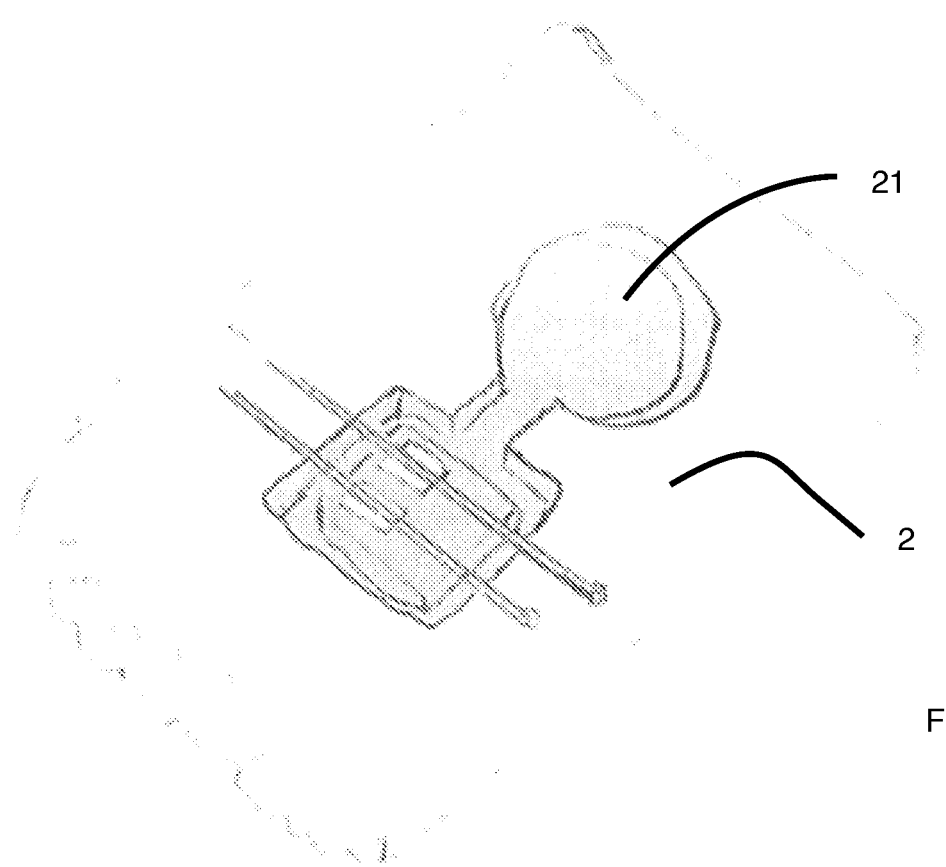
FIG. 3 illustrates the embodiment of FIG. 1 or 2 in which the patch has flown across two holes and an opening there between according to the invention.

During the lamination process the PU of patch 21 will flow through the opening 7 into the hole 3 all around the chip 4 as shown in FIG. 3. This confers a full protection to the chip 4 in terms of a crack prevention feature (CPF).

The lamination process is one example process in which the patch 21 may be caused to flow towards the hole 3. A different process in which material of the patch 21 is softened, for example a heating process may well be applied as an alternative. Also it may be possible to apply pressure on the patch 21 by any process other than lamination as appropriate.

Advantageously, at least a portion of the cavity circumference may be sealed with a carrier layer before the lamination, such as to obtain a below surface (not shown). In the figures the below surface would be situated under the chip 4, i.e., on a side of the chip 4 opposite to the side on which the antenna connections are connected. The below surface has the effect of avoiding that the patch material 21 flows between various layers (not shown) of the functional laminate rather than only around the chip 4.

The use of PU for the patch 21 in FIG. 2 is meant to be an illustrative example only. Other materials may be used instead of or in combination with PU, including for example TPU, glue, or any other plastic material as appropriate. It is noted that the patch 21 can be brought in the form of a solid patch, or injected as viscose glue. It should be a smooth and fluent material. Its essential required characteristic is that its melting point should be at a temperature below that of the melting point of the support layer 2.

The volume of the patch 21 is preferably chosen to correspond to the addition of the volume of the second hole 6, the volume of the opening 7 and the volume filling the surrounding of the chip 4 in the first hole 3. In a preferred embodiment, the patch 21 will present a surface corresponding more or less to the surface area of second hole 6 but will be thicker, such that it will protrude out of the second hole 6 once placed in it (as shown in FIG. 2). This configuration can be used advantageously at the moment when the assembly is laminated if the lamination parameters are tuned adequately. As the top lamination means (not shown) will first contact the portion of the patch 21 protuberating out of the surface of the support layer 2, the parameters of the starting phase of the lamination (also called "kiss pressure" phase) could be chosen to melt down the patch 21 and smoothly push the melted material through the opening 7 in direction of the hole 3. Ideally, the temperature during this phase will be over the melting point of the patch material but below the main lamination temperature (corresponding generally more or less to the melting point of the support layer 2). So, when the lamination step is engaged, with full pressure and temperature, the chip 4 is already fully embedded in the melted material from the patch 21.

In the prior art (as in the case of WO2009135823, WO200761303, U.S. Pat. No. 4,450,024, DE 19716912 or EP 1 16148), the patch material is positioned originally above or below the chip 4. This means that the assembly to be submitted to lamination shows a higher thickness exactly at the position of the chip, such that when the lamination starts, the first pressure will indirectly apply over the chip (at least until the patch material has melted down and flown in the space around the chip). Avoiding direct pressure over the chip is one of the numerous advantages of the invention in regards of the prior art.

Figure 4A:
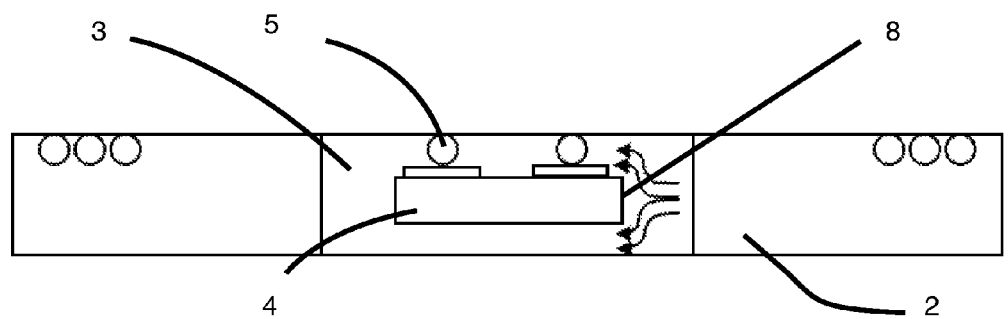
FIGS. 4a and 4b illustrate via side cut-view the positioning and embedding of the electrical component in the hole according a preferred embodiment of the invention.
Figure 4B:
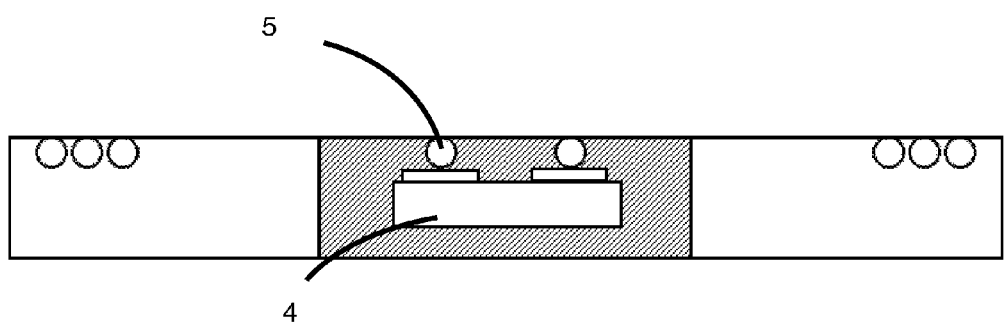

Other advantages of the invention in regards of the prior art will be better understood by means of the FIGS. 4a and 4b.

Ideally, and as illustrated in FIG. 4a, the chip 4 is hanging, attached to the wire 5, in middle of the hole 3 of the support layer 2. This means that when the patch material will flow out of the second hole 6 through the opening 7 (not shown on the Figure), the flowing material will face only the small side surface 8 of the chip 4 and will therefore easily be able to flow around it (up and down as shown by the arrows in FIG. 4a). This ensures a more uniform and complete surrounding (and so protection) of the chip 4 and its connections (see FIG. 4b) in comparison of the methods of the prior art.

If the patch material is positioned originally above or below the chip 4 (as in the case of WO2009135823, WO200761303, U.S. Pat. No. 4,450,024, DE 19716912 or EP 116148), the patch material is flowing essentially vertically and faces one of the two main (horizontal) faces of the chips. It results from this that the flowing material will barely be able to cover entirely the opposite main face of the chip.

As by the method of the invention the chip 4 is more uniformly embedded is the patch material, it allows to increase the flatness of the finished functional laminate product as compared to a product that includes the crack prevention feature from prior art. This increases drastically the printability of the surface of the finished product as it avoids the easy detection of the position of the chip (by detection of surface irregularities).

In regards to the prior art, a top layer is also no more needed in the lamination assembly (to ensure that the patch material is flowing in the right place during the lamination). It results that the method of the invention can be used to produce much thinner functional laminates corresponding for example uniquely to the substrate support layer 2 (so called "mono layer" inlays).

Figure 5A:
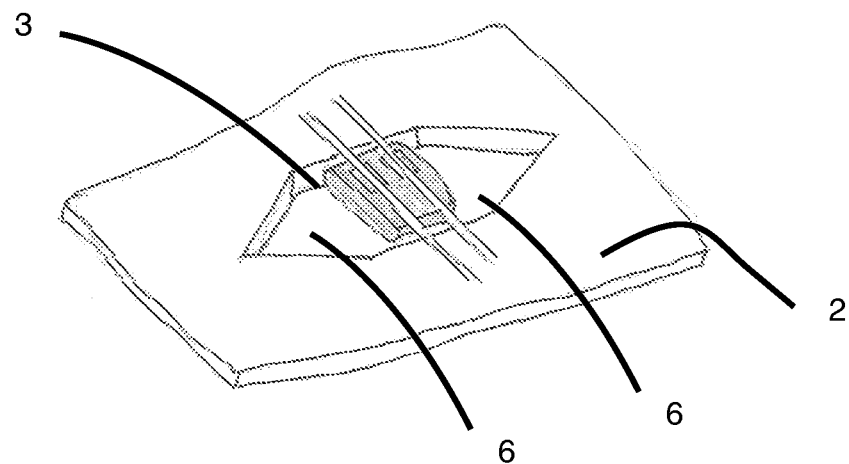
FIGS. 5a to 5c illustrate a different example embodiment of the support layer according to the invention.
Figure 5B:
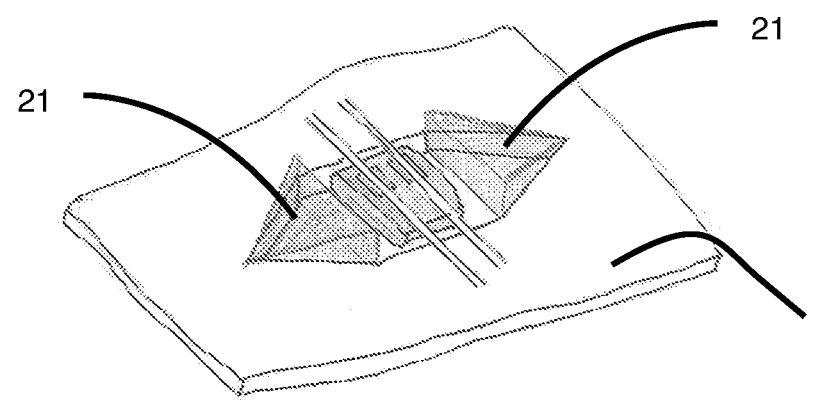
Figure 5C:
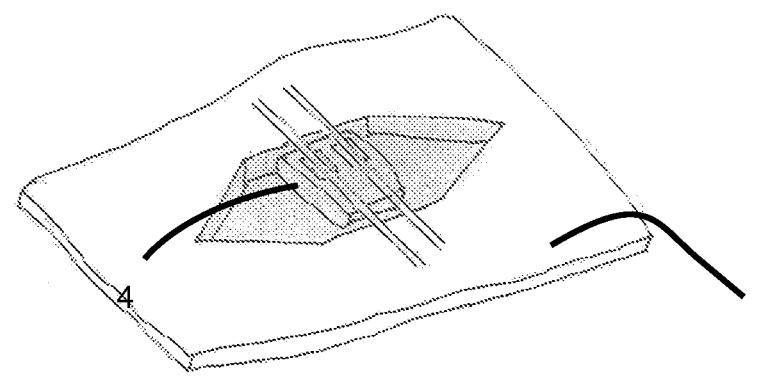

FIGS. 5a to 5c illustrate a further example embodiment of the invention in which the hole 3 in the support layer 2 has two additional (second) holes 6 positioned on opposite extremities of the hole 3. In this case, rather than having an explicit opening that connects the hole 3 and the additional holes 6, the former and the two latter share common sides. This is equivalent to having an opening with a width corresponding to the whole hole 3. The patch 21 is portioned in two portions, each one of which is positioned in a respective one of both additional holes 6, as shown in FIG. 4b and easily flows into the hole 3 to protect the chip module 4 as shown in FIG. 4c. One should note that the two holes 6 show a triangular form with their respective summit pointing in the opposite direction to the hole 3. This has the advantage that the counter pressure exerted by both sides of the triangle are combining to push the flowing melted material of the patches 21 in the direction of the hole 3 and the chip 4. Advantageously, the patches 21 show a corresponding trapezoid shape as illustrated in FIG. 5b. The flow of the patch 21 is the result of a lamination or other process similar as explained for FIGS. 2 to 4.

Figure 6:
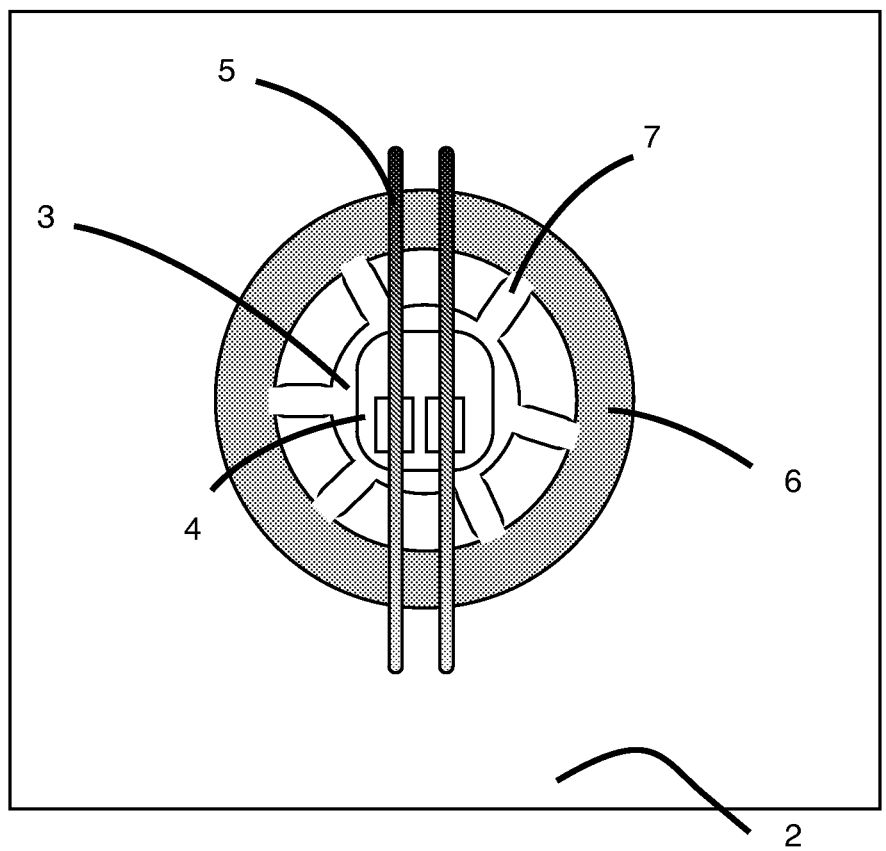
FIG. 6 illustrates an embodiment of a support layer according to the invention.

A person skilled in the art will easily extrapolate the embodiments of the invention as shown in the present description and figures to other embodiments that are covered by the scope of the invention. One of these other embodiments is shown in FIG. 6 and comprises the second hole 6 in the shape of an annular grove made in the support layer 2 and having the hole 3 with the chip 4 in its center. The annular grove/second hole 6 and the hole 3 may be connected by means of one or more openings 7 in form of channels made through the support layer 2, the channel(s) being preferably oriented in radial direction so that it (they) be as short as possible. All combinations are possible comprising also for example a plurality of first holes and a plurality of plurality of second holes connected together by a network of a plurality of openings such that at the end a plurality of electrical components are embedded in the material originating of a plurality of patches.

Of course, all the methods and embodiments described herein are to be regarded as illustrative examples and not construed in a limiting manner. Modifications are possible within the scope of the present invention, for example by use of an equivalent means and method steps. In addition, different embodiment described herein may be combined together according the circumstances.

The invention claimed is:

1. A method for protecting an electrical component in a support layer of a functional laminate, the method comprising the steps of
    providing the support layer with a first hole, a second hole and an opening connecting the first and the second holes together;
    positioning an electrical component inside the first hole;
    placing a solid patch of plastic material in the second hole;
    causing the material of the patch to flow through the opening from the second hole to the first hole, flowing around the electrical component in order to surround it.

2. The method of claim 1, wherein the step of causing the material of the patch to flow is a lamination step involving the support layer, whereby the patch melts down as it is submitted to heating and pressure.

3. The method of claim 1, wherein the melting point of the material of the patch is below the melting point of the material of the support layer.

4. The method of claim 1, further comprising a step of choosing a patch volume such as to correspond at least to the addition of a volume of the second hole, a volume of the opening and a volume filling the surrounding of the electrical component in the first hole.

5. The method of claim 1, wherein a plurality of second holes receive each one of a plurality of patches and wherein the material of this plurality of patches flows through a plurality of openings connecting each of the second holes to the first hole.

6. The method of claim 1, wherein the patch is originally thicker than the support layer such that it protrudes out of the second hole when it is placed in it.

7. The method of claim 1, wherein the support layer is provided with a carrier layer such as to create a below surface covering at least a part of bottom apertures corresponding respectively to the first or second holes or the opening on one the bottom face of the support layer.

8. The method of claim 7, wherein the carrier layer is sealed to the support layer such that at least a part of the said bottom apertures are hermetically closed.

9. The method of claim 1, wherein the electrical component is a RFID chip connected to an antenna fixed to the support layer.

* * * * *